United States Patent [19]

Sakai

[11] Patent Number: 5,801,840
[45] Date of Patent: Sep. 1, 1998

[54] APPARATUS FOR DECODING CODES WITH LESS MEMORY CAPACITY

[75] Inventor: Katsumi Sakai, Tokyo, Japan

[73] Assignee: NEC Corp., Tokyo, Japan

[21] Appl. No.: 655,351

[22] Filed: May 23, 1996

[30] Foreign Application Priority Data

May 24, 1995  [JP]  Japan .................... 7-124136

[51] Int. Cl.$^6$ ................ H04N 1/419; H04N 1/41; H03M 7/00; H03M 7/40
[52] U.S. Cl. ................... 358/427; 358/261.1; 341/67; 341/106; 341/65; 382/245; 382/246; 382/233
[58] Field of Search ................ 358/426, 427, 358/430, 261.1, 261.2; 382/245, 233, 246; 341/63, 65, 67, 106

[56] References Cited

U.S. PATENT DOCUMENTS

| | | | |
|---|---|---|---|
| 4,716,471 | 12/1987 | Yokomizo | 358/261.1 |
| 5,268,769 | 12/1993 | Tsuchiya et al. | 358/427 |
| 5,404,138 | 4/1995 | Kim et al. | 341/67 |
| 5,428,356 | 6/1995 | Ozaki | 341/67 |
| 5,467,088 | 11/1995 | Kinouchi et al. | 341/65 |
| 5,550,542 | 8/1996 | Inoue | 341/67 |

FOREIGN PATENT DOCUMENTS

| | | |
|---|---|---|
| 60-194875 | 10/1985 | Japan . |
| 2-2350 | 1/1990 | Japan . |
| 4-51720 | 2/1992 | Japan . |

*Primary Examiner*—Kim Yen Vu
*Assistant Examiner*—Kimberly A. Williams
*Attorney, Agent, or Firm*—Ostrolenk, Faber, Gerb & Soffen, LLP.

[57] ABSTRACT

In a modified Huffman (MH) code decoding apparatus, an MH code is composed of a first part and second part. The apparatus includes a code conversion table for outputting a run data in response to an index data and a code length table. The index data is composed of a color data indicative of a color of a run corresponding to the current MH code, a first code length data associated with a length of the first part of the current MH code, and a second part data indicative of the second part of the current MH code. The run data is composed of the color data, a code type data indicative of whether the current MH code is a terminate code or a make-up code, and a run length data indicative of a length of the run. The apparatus further includes an index generating section for combining the color data, the first code length data and the second part data on the first code length data of a previous MH code and a second code length data indicative of a length of the second part of the previous MH code such that the index is generated. The index is supplied to the code conversion table. The code length table outputs the second code length data for a next MH code to the index generating section in response to the run data outputted from the code conversion table. An image generating section generates an image corresponding to the current MH code in accordance with the run data outputted from the code conversion table.

13 Claims, 8 Drawing Sheets

MH CODE FORMAT

INPUT SDDRESS TO ROM

OUTPUT DATA FROM ROM

MH CODE FORMAT

INPUT ADDRESS TO ROM1

OUTPUT DATA FROM ROM1 AND INPUT ADDRESS TO ROM2

OUTPUT DATA FROM ROM2

Fig. 6

Fig. 7  FOR STANDARD SHEET WIDTH

| RUN LENGTH | WHITE RUN CODE | BLACK RUN CODE | RUN LENGTH | WHITE RUN CODE | BLACK RUN CODE |
|---|---|---|---|---|---|
| 64 | 11011 | 0000001111 | 960 | 011010100 | 0000001110011 |
| 128 | 10010 | 000011001000 | 1024 | 011010101 | 0000001110100 |
| 192 | 010111 | 000011001001 | 1088 | 011010110 | 0000001110101 |
| 256 | 0110111 | 000001011011 | 1152 | 011010111 | 0000001110110 |
| 320 | 00110110 | 000000110011 | 1216 | 011011000 | 0000001110111 |
| 384 | 00110111 | 000000110100 | 1280 | 011011001 | 0000001010010 |
| 448 | 01100100 | 000000110101 | 1344 | 011011010 | 0000001010011 |
| 512 | 01100101 | 0000001101100 | 1408 | 011011011 | 0000001010100 |
| 576 | 01101000 | 0000001101101 | 1472 | 010011000 | 0000001010101 |
| 640 | 01100111 | 0000001001010 | 1536 | 010011001 | 0000001011010 |
| 704 | 011001100 | 0000001001011 | 1600 | 010011010 | 0000001011011 |
| 768 | 011001101 | 0000001001100 | 1664 | 011000 | 0000001100100 |
| 832 | 011010010 | 0000001001101 | 1728 | 010011011 | 0000001100101 |
| 896 | 011010011 | 0000001110010 | EOL | 000000000001 | 000000000001 |

Fig. 8  FOR WIDER SHEET WIDTH

| RUN LENGTH | CODE (COMMON TO WHITE RUN AND BLACK RUN) | RUN LENGTH | CODE (COMMON TO WHITE RUN AND BLACK RUN) |
|---|---|---|---|
| 1792 | 00000001000 | 2240 | 00000001011 0 |
| 1856 | 00000001100 | 2304 | 00000001011 1 |
| 1920 | 00000001101 | 2368 | 00000001110 0 |
| 1984 | 000000010010 | 2432 | 00000001110 1 |
| 2048 | 000000010011 | 2496 | 00000001111 0 |
| 2112 | 000000010100 | 2560 | 00000001111 1 |
| 2176 | 000000010101 | | |

APPARATUS FOR DECODING CODES WITH LESS MEMORY CAPACITY

BACKGROUND OF THE INVENTION

1. Field of the Invention

The present invention relates to a code decoding apparatus, and more particularly to an apparatus for decoding codes such as Modified Huffman codes with less memory capacity.

2. Description of Related Art

First, a Modified Huffman code (to be referred to as "MH code" hereinafter) will be briefly described. In the MH code, the number of continuous pixels having a same color, i.e., a run length is coded using a terminate code and makeup code. The terminate code and make-up code are different dependent upon the color of pixels even in a case of a same run length, as shown in FIGS. 6, 7 and 8. That is, different codes are used for a black run length and a white run length. When the run length is divided by "64", a quotient corresponds to a make-up code and a remainder corresponds to a terminal code. Thus, if the quotient is M and the remainder is T, the run length RL can be expressed by the following equation.

$$RL = M \times 64 + T$$

In this manner, the terminate code expresses a run length in a range of 0 to 63 and the make-up code expresses a run length of multiple of 64 up to 2560 at a maximum. For instance, in a case of a binary image of black and white as shown in FIG. 5, the run length is "3" because the three white pixels continues from the head bit portion. Referring to a terminate code table for white run shown in FIG. 6, the MH code of "1000" is obtained for the three white pixels. That is, a run length in a range of 0 to 63 is coded using only the terminate code table. On the other hand, in a case of a run length of more than 64 pixels of a same color, the run length is coded using make-up code tables shown in FIG. 7 and 8. A difference between the actual run length and the run length expressed by the make-up code is expressed by a terminate code which follows the make-up code. See the code corresponding to the white run 130 shown in FIG. 5. In the MH coding, the coding is started with a white run. If the head pixel is black, a white run having the run length of "0" is first coded.

Next, the feature of the MH code will be described. An MH code has a format shown in FIG. 2A. The MH code possibly has 7 code bits of "0" at a maximum before a bit of "1" which appears first and 7 code bits at a maximum following the first appearing code bit of "1". Also, the code length of the MH code is 13 at a maximum.

Next, a conventional MH code decoding apparatus will be described. FIG. 1 is a block diagram of the conventional MH code decoding apparatus as shown in Japanese Examined Patent Disclosure (JP-B2-Hei2-2350). Referring to FIG. 1, the first 8 bits of a string of continuous MH code bits is inputted to a code input register 101 of 8 bits. A 0 count circuit 103 counts the number of continuous code bits of "0" from the leftmost bit, i.e., the head code bit to a first appearing code bit of "1" in the code bits stored in the code input register 101 and stores the count in a 0 count register 105. The count stored in the 0 count register 105 is selected by a selector 106 and transferred to a shifter 107. The shifter 107 controls the code input register 101 to shift the stored code bits in a left direction by a value obtained by adding "1" to the count from the 0 count register 105. At the same time, the shifter 107 controls the code input register 101 to input next code bits by the number of shifted code bits. Thus, the 8 code bits following the first appearing code bit of "1" is set in the code input register 101. The 7 code bits set in the register 101, a binary color designation data of 1 bit of a black/white register 102 which indicates whether a run to be generated is black or white, and the count of 3 bits stored in the 0 count register 105 are supplied as an address to a ROM 111 in which a decoding conversion table is stored, as shown in FIG. 2B. 10-bit data is outputted from the ROM 111 in accordance with the address. The 10-bit data is composed of a code length data, (i.e., the number of code bits following the first appearing code bit of "1": 3 bits), a code type data, (i.e., a T/M bit indicative of whether the decoded MH code is a make-up code (M) or a terminate code (T): 1 bit), and a run length data corresponding to a run length (RL) obtained by decoding (6 bits).

The code type data of 1 bit and run length data of 6 bits of the 10-bit data outputted from the ROM 111 and the color designation data of 1 bit from the register 102 are supplied to an image generating circuit 108. The target run is generated by the image generating circuit 108 based on the these data and is supplied to a first-in and first-out (FIFO) memory 109 and outputted from the memory 109.

In order to decode the next MH code, the number of code bits of the decoded MH code is outputted from the ROM 111 and selected by the selector 106 and supplied to the shifter 107. The shifter 107 controls the code input register 101 to shift the stored code bits in a left direction by the number of code bits of the decoded MH code. At the same time, code bits of the MH code string are inputted in the code input register 101 by the number of code bits of the decoded MH code.

In the above conventional MH code decoding apparatus, the 11-bit input address is required to the decoding conversion table stored in the ROM 111. Also, 10-bit output is required to the decoding conversion table. That is, the ROM needs to have a memory capacity of 20,480 (=211×10 bits).

Further, for instance, in a case where the MH code is "10" for a black run having the run length of "3", data indicating that the number of code bits is "2", data indicating that code is a terminate code, and data indicating that the run length is "3" are stored in all the addresses of "10000XXXXXX" of the ROM 111, where X may be "0" or "1". That is, the memory capacity of $(2^6-1) \times 10$ bits is wasted.

In order to solve the problem, the technique is disclosed in Japanese Laid Open Patent Disclosure (JP-A-Hei4-51720) in which a decoding conversion table is divided into two using a decode end flag for reducing the memory capacity of a decoding table memory.

As described above, in a conventional MH code decoding apparatus using a single decoding table, there is a problem in that a decoding table is required to have a large memory capacity. In a conventional MH code decoding apparatus in which the decoding conversion table is divided into two, it is necessary to use the decode end flag.

SUMMARY OF THE INVENTION

The present invention has, as an object, to provide a method and apparatus for decoding a code string with less memory capacity without using a decode end flag.

In order to achieve an aspect of the present invention, a modified Huffman (MH) code decoding apparatus includes a code conversion table for outputting a run data in response to an index data, wherein the index data is composed of a color data indicative of a color of a run corresponding to a current MH code to be decoded, a first code length data associated with a length of a first part of the current MH code, and a second part data indicative of a second part of the current MH code, and wherein the run data is composed of the color data, a code type data indicative of whether the current MH code is a terminate code or a make-up code, and a run length data indicative of a length of the run, an index generating section for combining the color data, the first code length data and the second part data while selecting the current MH code of an MH code bit string based on the first code length data of a previous MH code and a second code length data indicative of a length of the second part of the previous MH code such that the index is generated, and supplying the index to the code conversion table, a code length table for outputting the second code length data for a next MH code to the index generating section in response to the run data outputted from the code conversion table, and an image generating section for generating an image corresponding to the current MH code in accordance with the run data outputted from the code conversion table.

Here, the first code length data is the number of continuous bits of 0 from a head bit of the current MH code and the index generating section includes a 0 detecting section for detecting the number of continuous bits of 0 from the head bit of the current MH code to generate the first code length data indicative of the number of continuous bits of 0 in a binary manner. The index generating section may shift the MH code bit string by a bit length obtained by adding one to the first code length data and then by a bit length designated by the second code length data. Alternatively, the index generating section shifts the MH code bit string by a bit length obtained by adding one, the first code length data and the second code length data.

In the preferred embodiment, the color data is one bit in length, the first code length data is three bits in length, and the second part data is seven bits in length. Also, the code type data is one bit in length and the run length data is six bits in length. The code conversion table and the code length table are stored in read only memories, respectively. As a result, the memory capacity can be reduced.

In order to achieve another aspect of the present invention, a method of decoding a modified Huffman (MH) code bit string, includes the steps of:

inputting and storing MH code bits of an MH code bit string for a current MH code in a code input register by a predetermined bit length;

detecting the number of continuous bits of 0 from a head bit of the current MH code to generate a first code length data, a first part of the current MH code being composed of the continuous bits of 0 and a bit of 1 immediately after the continuous bits of 0;

supplying as an index to a code conversion table, a color data indicative of a color of a run corresponding to the current MH code, the second part data and the first code length data such that a run data is outputted, wherein the run data is composed of the color data, a code type data indicative of whether the current MH code is a terminate code or a make-up code, and a run length data indicative of a length of the run;

outputting a second code length data indicative of a length of the second part of the current MH code from a code length table for a next MH code in response to the run data; and generating an image corresponding to the current MH code in accordance with the run data outputted from the code conversion table.

BRIEF DESCRIPTION OF THE DRAWINGS

Figure 6:
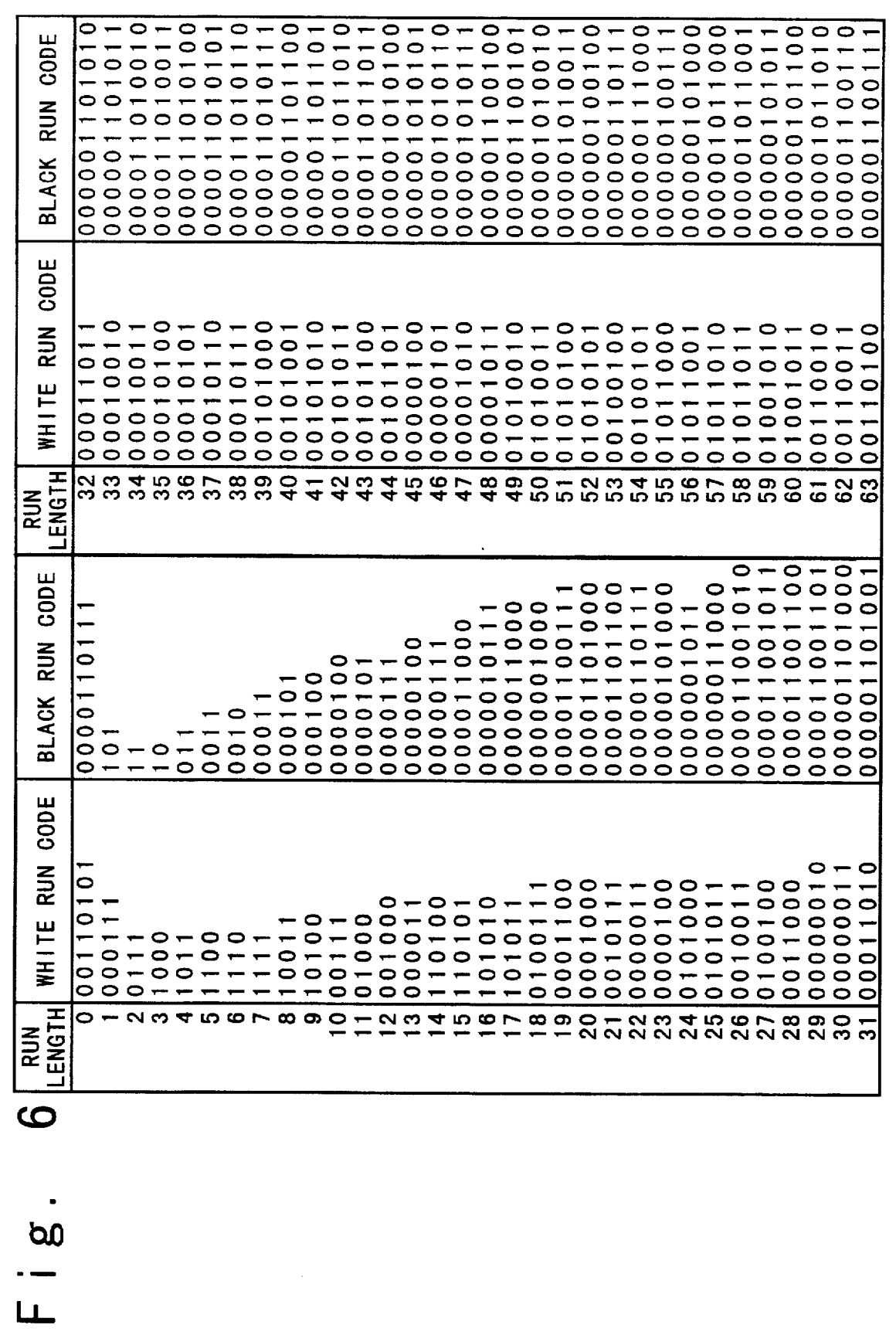

FIG. 6 is a table showing the MH terminate codes for black and white runs;

FIGS. 7 and 8 are tables showing the MH make-up codes; and

DESCRIPTION OF THE PREFERRED EMBODIMENTS

The code decoding apparatus of the present invention for decoding, for example, a modified Huffman (MH) code will be described below in detail with reference to the accompanying drawings.

Figure 1:
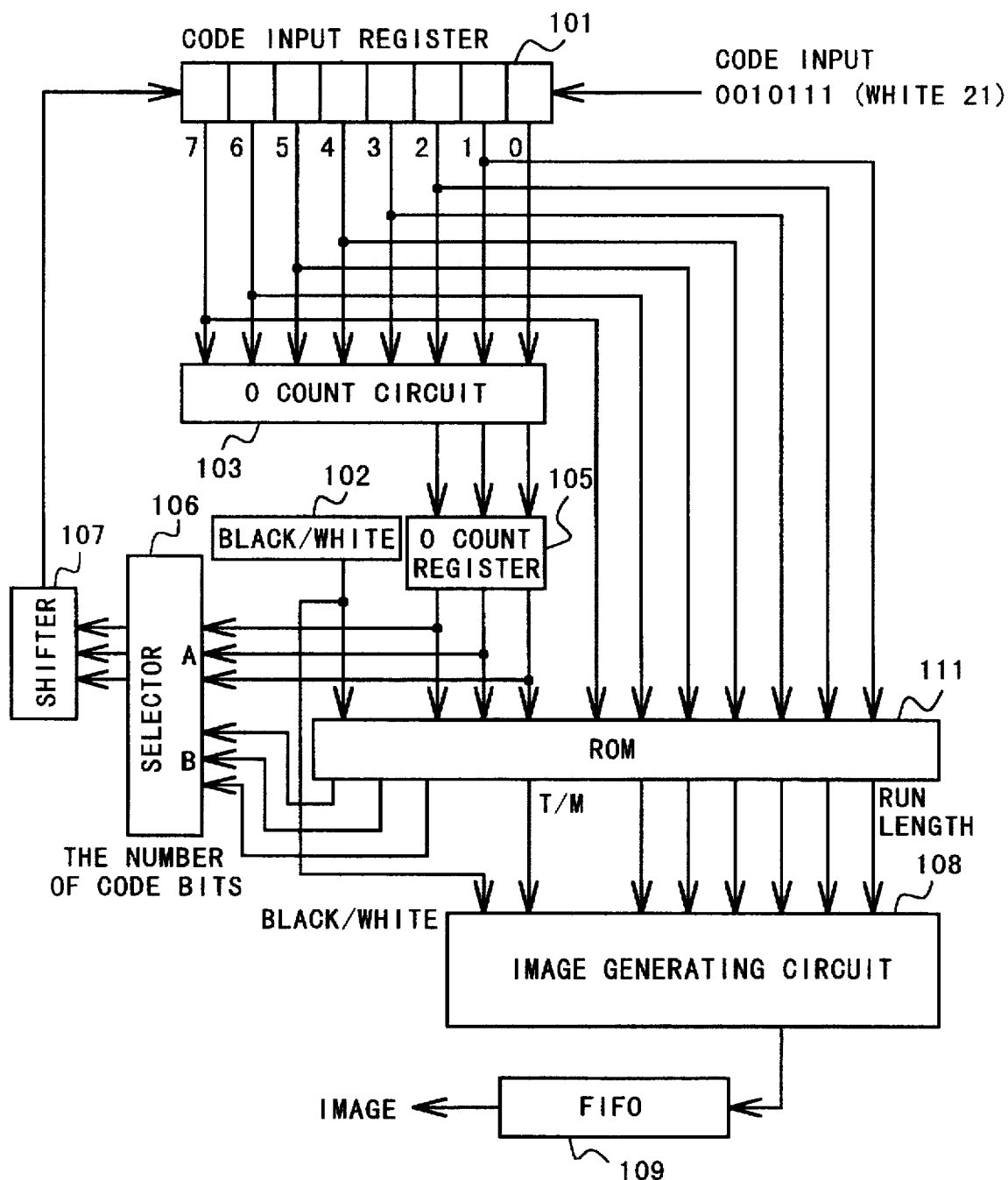
FIG. 1 is a block diagram of a conventional code decoding apparatus.
Figure 2A:
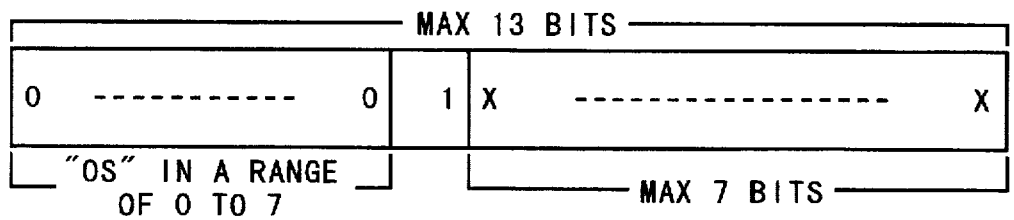
FIG. 2A is a diagram illustrating the format of MH code as a type of code.
Figure 2B:
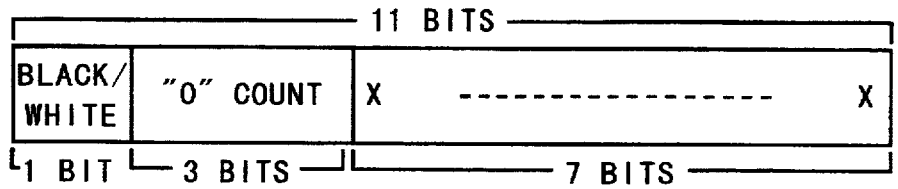
FIG. 2B is a diagram illustrating the format of an address inputted to a decoding conversion table shown in FIG. 1.
Figure 2C:
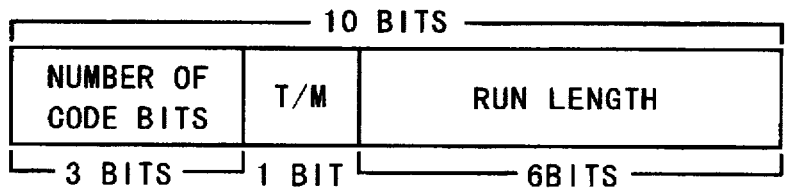
FIG. 2C is a diagram illustrating the format of an output data outputted from the decoding conversion table shown in FIG. 1.
Figure 3:
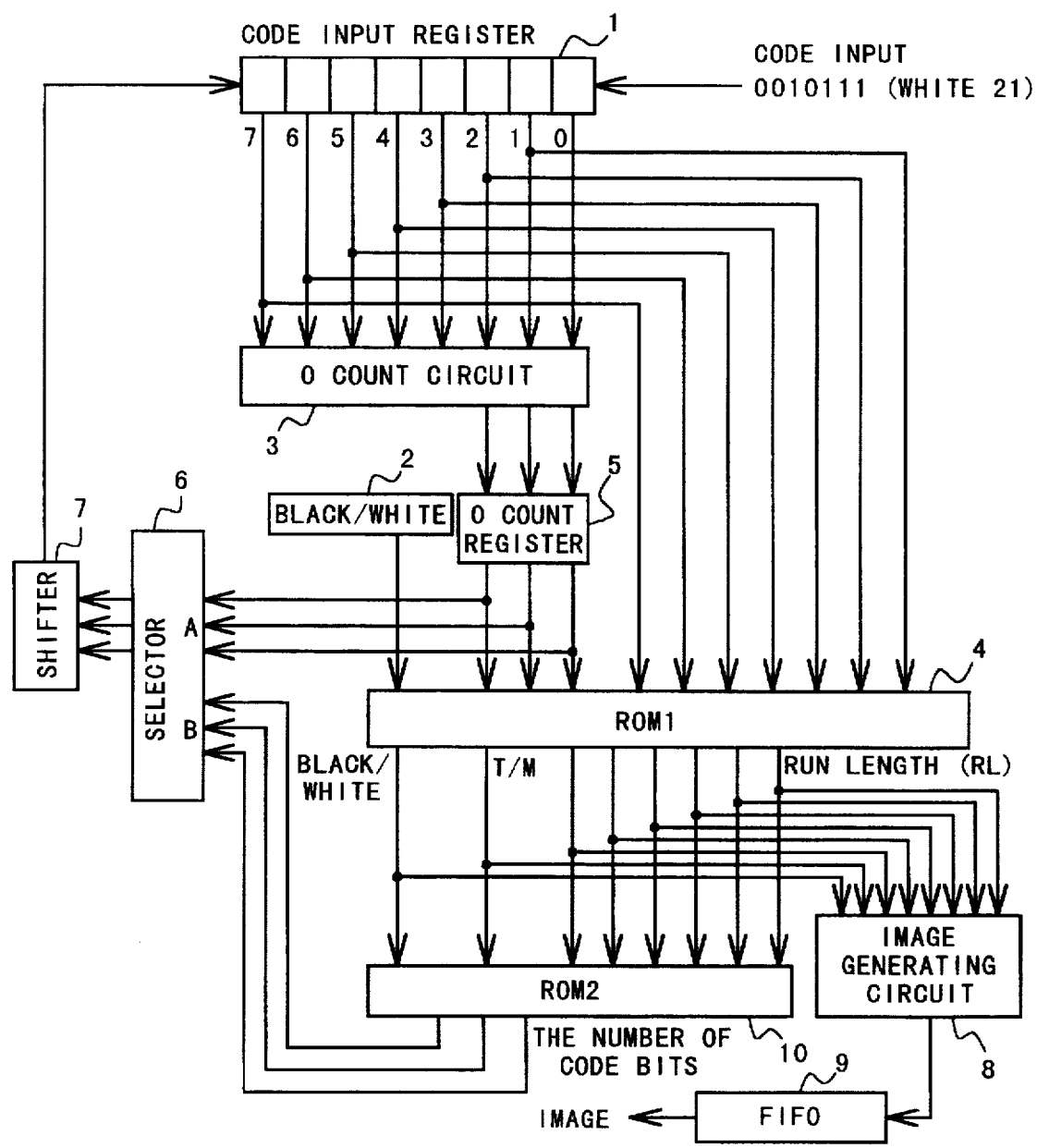
FIG. 3 is a block diagram illustrating a code decoding apparatus according to an embodiment of the present invention.
Figure 4A:
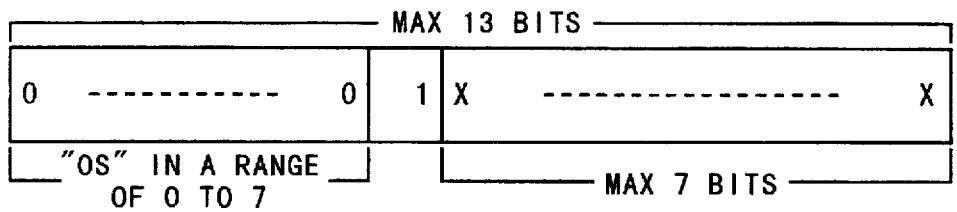
FIG. 4A is a diagram illustrating the format of MH code as a type of code.
Figure 4B:
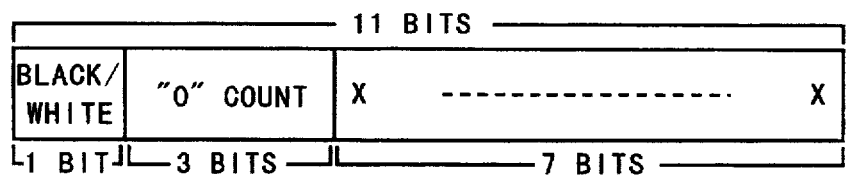
FIG. 4B is a diagram illustrating the format of an address inputted to a decoding conversion table shown in FIG. 3.
Figure 4C:
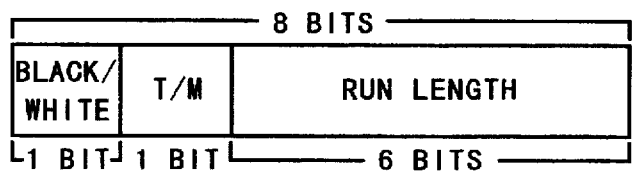
FIG. 4C is a diagram illustrating the format of an output data outputted from the decoding conversion table shown in FIG. 3.
Figure 4D:
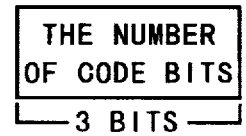
FIG. 4D is a diagram illustrating the format of an output data outputted from a code length table shown in FIG. 3.
Figure 5:
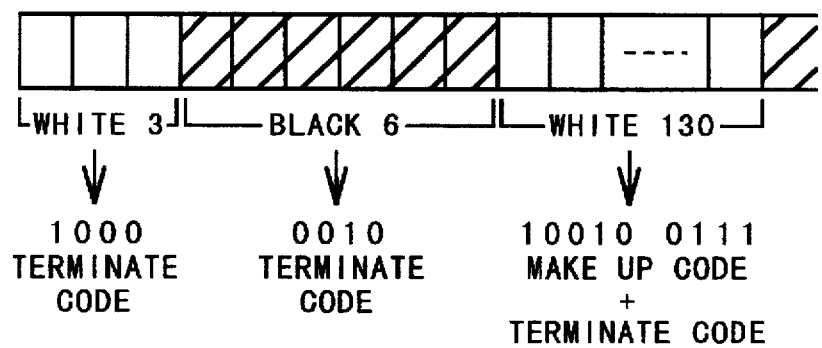
FIG. 5 is a diagram illustrating an example of MH code string.

FIG. 3 is a block diagram illustrating the structure of the MH code decoding apparatus according to an embodiment of the present invention. Referring to FIG. 3, a code input register 1 of 8 bits inputs and stores a part of a string of continuous MH code bits in response to a shift control signal and outputs the stored 8-bit MH code bits. A 0 count circuit 3 counts the number of continuous bits of "0" from the leftmost code bit (head code bit) to the code bit of "1" which appears first in the MH code stored in the code input register 1 and outputs the count to a 0 count register 5. The 0 count register 5 holds the count until next count is inputted. A color designation register 2 stores 1-bit data to designate whether an MH code to be decoded is for white run or for black run. The color designation data is "0" for the white run and "1" for the black run. The color designation data is inverted when a previous terminate code or a previous combination of a terminate code and a make-up code is decoded and held until a current terminate code or a current combination of a terminate code and a make-up code is completely decoded. A read only memory (ROM1) 4 stores a decoding conversion table. The ROM1 4 inputs as an address 11 bits, composed of the 1-bit color designation data from the register 2, 3-bit 0 count from the 0 count register 5, and 7 code bits from the code input register 1 which follow the first appearing code bit of "1". Also, the ROM1 4 outputs an 8-bit decoding result composed of 1-bit color designation data, 1-bit code kind data indicative of whether the decoded MH code is a terminate code or make-up code, and 6-bit run length data indicative of the run length of the run to be generated. An image generating circuit 8 generates an image from the 8-bit data outputted from the ROM1 4. The generated image is supplied a first-in and first-out (FIFO) memory 9 such that it is outputted as an image data. A ROM2 10 inputs the 8-bit data from the ROM1 4 as an address and outputs 3-bit code length data indicative of the number of code bits following the first appearing code bit of "1" and stored in the code input register 1. A selector 6 selects one of the 3-bit 0 count data from the 0 count register 5 and the 3-bit code length data from the ROM2 10 and outputs the selected 3-bit data to a shifter 7. The shifter 7 issues a shift control data to the code input register 1 in accordance with the selected 3-bit data to control the shift operation of the code input register 1. When the selector 6 selects the 3-bit data from the 0 count register 5 for a first section of the MH code to be decoded, the shifter 7 issues the shift control signal to the code input register 1 such that the code string stored in the code input register 1 is shifted in a left direction by the number of code bits designated by the selected 3-bit data plus "1". At the same time, a part of the MH code string is inputted into the code input register 1 by the number of shifted code bits. When the selector 6 selects the 3-bit data from the ROM2 10 for a second section of the MH code to be decoded, the shifter 7 issues the shift control signal to the code input register 1 such that the code string stored in the code input register 1 is shifted in a left direction by the number of code bits designated by the selected 3-bit data. At the same time, a part of the MH code string is inputted into the code input register 1 by the number of shifted code bits.

Next, the operation of the code decoding apparatus of the present invention will be described below. For instance, assume that an MH code of "0010111" corresponding to a white run having the run length of "21" is located at the head position of the MH code bit string. The code bits of "0010111" is set in the code input register 1. The 7 code bits set in the register 101 are supplied to the 0 count circuit 3 and the ROM1 4. The 0 count circuit 3 counts the number of code bits of "0". In this example, the count is "2". The binary value of "2" is supplied to the 0 count register 5 and held therein. The binary value of "2" is selected by the selector 6 and supplied to the shifter 7. The shifter 7 adds "1" to the "2" to obtain "3". The shifter 7 issues the shift control signal to the code input register 1 based on the obtained "3". The code input register 1 shifts the stored code bits by 3 bits in a left direction. At the same time, code bits of the next MH code are inputted to the code input register 1. As a result, code bits of "0111XXXX" are stored in the code input register 1. The 7 code bits of "0111XXX" are supplied to the ROM1 4 in addition to the color designation data from the black/white register 2 which is "0" in a case of the white run, and the count of code bits of "0" from the 0 count register 5 which is "2", i.e., "010". The decoding conversion table stored in the ROM1 4 outputs 8-bit data in accordance with the address. The 8-bit data is composed of the color designation data of "0", a code kind data of "0" indicative of the terminate code, and the run length data of "010101" corresponding to "21". The 8-bit data is supplied to the image generating circuit 8 and the ROM2 10. The image generating circuit 108 generates an image of the white run having the run length of "21" and supplies to the FIFO memory 9 which outputs the run image. The ROM2 10 outputs the code length data of "100" indicative of the number of bits of "0111". The code length data is selected by the selector 6 and supplied to the shifter 7. The shifter 7 issues the shift control signal to the code input register 1 based on the selected code length data of "100". The code input register 1 shifts the stored code bits by 4 bits in a left direction. At the same time, code bits of the next MH code are inputted to the code input register 1. As a result, the next MH code is stored in the code input register 1 from the head bit position. Thereafter, the above-mentioned operation is repeated.

As described above, according to the present invention, two tables, the decoding conversion table and the code length table are used. Therefore, the required memory capacity is $2^{11} \times 8 + 2^8 \times 3 = 17,150$ bits, which is reduced compared to the decoding conversion table in the conventional code decoding apparatus.

Further, the color designation data, code kind data and run length data is outputted from the ROM1 and used to generate an image by the image generating circuit 8. In this manner, the image can be generated without using an additional data such as a code decoding end flag regardless of whether the MH code to be decoded is a terminate code or a make-up code.

Figure 9:
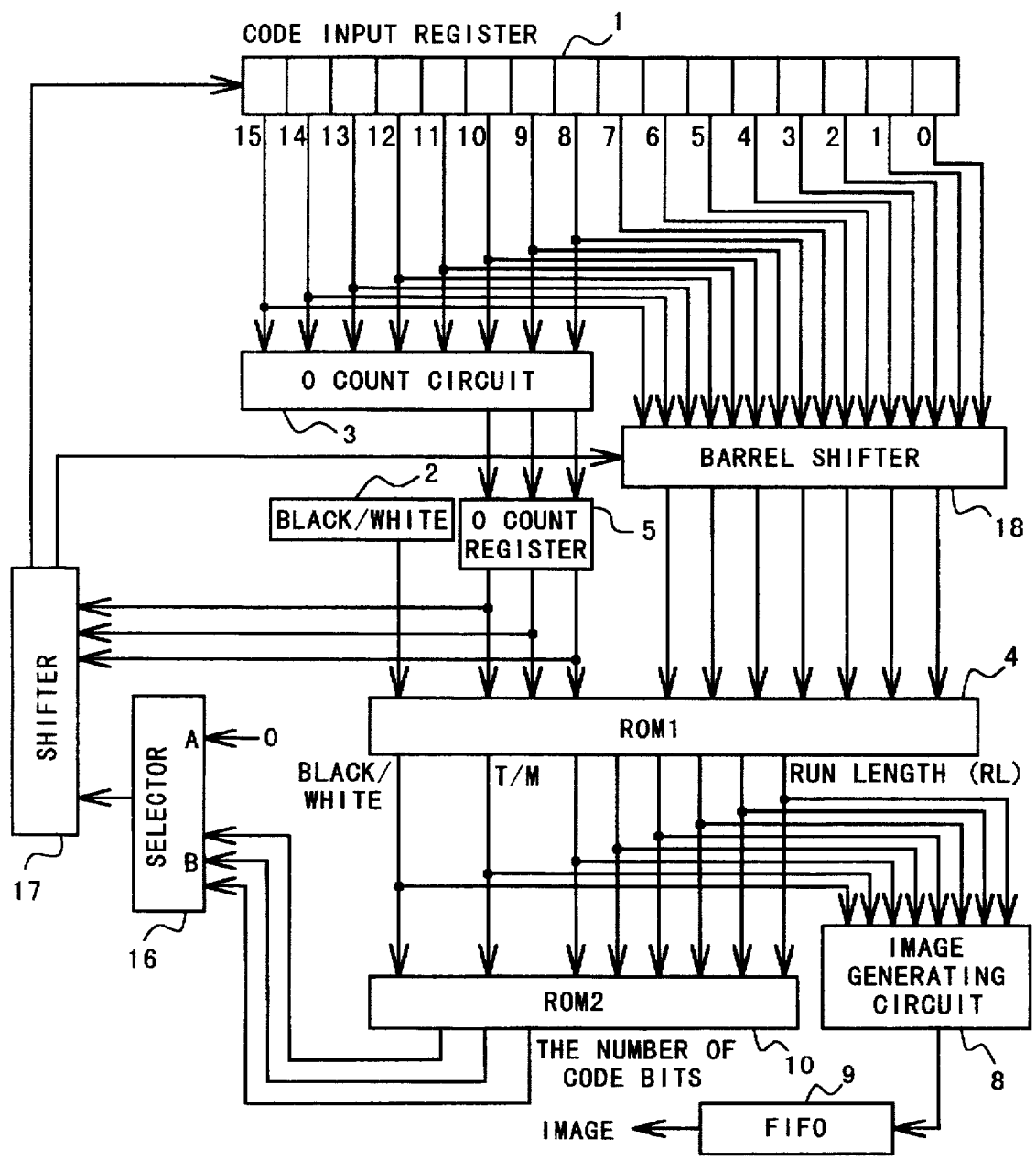
FIG. 9 is the code decoding apparatus according to another embodiment of the present invention.

Next, the code decoding apparatus according to the second embodiment of the present invention will be described in connection with FIG. 9. In the embodiment, the code input register 1 has 16-bit width. Of the MH code string stored in the code input register 1, the upper 8 bits are supplied to the 0 count circuit 3 and the full 16 bits are supplied to a barrel shifter 18 which is provided in the embodiment. The output of the 0 count circuit 3 is supplied to the 0 count register 5 and the value CNT0 held in the register 5 is supplied to the ROM1 4 and shifter 17. A selector 16 is supplied with "0" and the output of the ROM2 10. In the first stage of decoding operation, "0" is selected and supplied to the shifter 17. The shifter adds "1" to the sum of the output of the 0 count register 5 and the output of the selector 16, i.e., calculates (CNT0+"0"+"1") to output the calculation result to the barrel shifter 18. The barrel shifter 18 selects from the 16 code bits supplied from the code input register 1 6 bits starting from the next code bit of the bit which is designated by the output from the shifter 17. After the code is decoded in the same manner as described above, decoded code bit length is outputted from the ROM2 10. In the second stage of the decoding operation, the output of the ROM2 10 is selected by the selector 16. The shifter adds "1" to the sum of the output of the 0 count register 5 and the output of the selector 16 to output the addition result to the code input register 1. The code input register 1 shifts the stored code bits in a left direction in FIG. 9 and inputs new code bits of the string by the number of code bits shifted. In this case, the MH code of the code input register 1 can be collectively decoded and therefore the decoding operation speed can be increased.

What is claimed is:

1. A modified Huffman (MH) code decoding apparatus comprising:

a code conversion table outputting run data in response to index data, the index data is composed of color data indicative of a color of a run corresponding to a current MH code to be decoded, first code length data associated with a length of a first part of the current MH code, and second part data indicative of a second part of the current MH code, the run data is composed of the color data, code type data indicative of whether the current MH code is a terminate code or a make-up code, and run length data indicative of a length of the run;

index generating means for combining the color data, the first code length data and the second part data while selecting the current MH code of an MH code bit string based on the first code length data of a previous MH code, and based on a second code length data indicative of a length of the second part of the previous MH code such that the index data is generated, and supplying the index data to said code conversion table;

a code length table outputting the second code length data for a next MH code to said index generating means in response to the run data outputted from said code conversion table; and image generating means for generating an image corresponding to the current MH code in accordance with the run data outputted from said code conversion table.

2. A MH code decoding apparatus according to claim 1, wherein the first code length data is the number of continuous bits of 0 from a head bit of the current MH code.

3. A MH code decoding apparatus according to claim 2, wherein said index generating means includes 0 detecting means for detecting the number of continuous bits of 0 from the head bit of the current MH code to generate the first code length data indicative of the number of continuous bits of 0 in a binary manner.

4. A MH code decoding apparatus according to claim 2, wherein said index generating means shifts the MH code bit string by a bit length obtained by adding one to the first code length data and then by a bit length designated by the second code length data.

5. A MH code decoding apparatus according to claim 2, wherein the color data is one bit in length, the first code length data is three bits in length, and the second part data is seven bits in length.

6. A MH code decoding apparatus according to claim 1, wherein the code type data is one bit in length and the run length data is six bits in length.

7. A MH code decoding apparatus according to claim 1, wherein said code conversion table and said code length table are stored in read only memories, respectively.

8. A method of decoding a modified Huffman (MH) code bit string, comprising the steps of:

inputting and storing MH code bits of an MH code bit string for a current MH code in a code input register by a predetermined bit length;

detecting the number of continuous bits of 0 from a head bit of the current MH code to generate a first code length data, a first part of the current MH code being composed of the continuous bits of 0 and a bit of 1 immediately after the continuous bits of 0;

supplying as an index to a code conversion table, a color data indicative of a color of a run corresponding to the current MH code, the first part data and the first code length data such that run data is outputted, the run data is composed of the color data, a code type data indicative of whether the current MH code is a terminate code or a make-up code, and run length data indicative of a length of the run;

outputting a second code length data indicative of a length of a second part of the current MH code from a code length table for a next MH code in response to the run data; and generating an image corresponding to the current MH code in accordance with the run data outputted from said code conversion table.

9. A method according to claim 8, further comprising the steps of:

shifting the MH code bit string by the first code length data plus 1 such that code bits following a bit of 1 immediately after the continuous bits of 0 are stored as the second part of the current MH code in the code input register; and shifting the MH code bit string by the second code length data such that a next MH code is stored in the register.

10. A method according to claim 8, further comprising the step of:

shifting the MH code bit string by a bit length obtained by adding the first code length data, one, and the second code length data such that a next MH code is stored from a head bit position in the register.

11. A method according to claim 8, wherein the color data is one bit in length, the first code length data is three bits in length, and the second part data is seven bits in length.

12. A method according to claim 8, wherein the code type data is one bit in length and the run length data is six bits in length.

13. A method according to claim 8, wherein said code conversion table and said code length table are stored in read only memories, respectively.

* * * * *